United States Patent [19]

Collins et al.

[11] Patent Number: 4,642,562

[45] Date of Patent: Feb. 10, 1987

[54] PHASE DIFFERENCE DEMODULATOR

[75] Inventors: David W. Collins, Rochester; Michael A. Weed, Spring Valley, both of Minn.

[73] Assignee: International Business Machines Corporation, Armonk, N.Y.

[21] Appl. No.: 625,305

[22] Filed: Jun. 27, 1984

[51] Int. Cl.$^4$ .......................................... G01R 25/00
[52] U.S. Cl. .................................. 324/83 D; 360/77
[58] Field of Search ............... 324/83 D, 83 A, 83 R, 324/76 A, 78 Z; 328/134, 133, 139; 307/514, 520, 528, 527, 525, 526, 529; 377/19; 364/481, 486, 487; 360/77; 318/608, 683, 314

[56] References Cited

U.S. PATENT DOCUMENTS 3,984,771 10/1976 Nossen et al. .................... 324/83 D
4,549,232 10/1985 Axmear et al. ....................... 360/77

Primary Examiner—Michael J. Tokar

Attorney, Agent, or Firm—Hugh D. Jaeger

[57] ABSTRACT

Phase difference demodulator for measuring the phase difference between two signals of the same frequency, time multiplexed onto a single analog input, and providing a precision digital output signal representing the phase difference. The most significant part of the signal, the upper bits, is determined by digital processes while analog-to-digital processes determines the lower bits. The analog-to-digital processes utilize an integrating capacitor and current sources for demodulating servo bursts for obtaining phase difference. The current sources are a coarse current and a fine current 1/16 in value of the coarse current source. The capacitor is switched in a differential scheme by the integrator to determine error during the digital approximation of the upper bits in analog to digital conversion. The same capacitor and current sources are utilized in the error acquired in analog form and then during the analog-to-digital conversion.

14 Claims, 6 Drawing Figures

FIG. 3A

| S5 | S4 | S3 | S2 | S1 | S0 | STATE | -INT UP | -INT DWN | INT | -FINE |
|---|---|---|---|---|---|---|---|---|---|---|
| 0 | 0 | 0 | 1 | 0 | 0 | CLEAR | 1 | 1 | 0 | 1 |
| 0 | 0 | 0 | 1 | 0 | 0 | 0 | 1 | 1 | 0 | 1 |
| 0 | 0 | 0 | 1 | 0 | 1 | 1 | 0 | 1 | 0 | 1 |
| 0 | 0 | 0 | 1 | 1 | 1 | 2 | 0 | 1 | * | 1 |
| 0 | 0 | 0 | 1 | 1 | 0 | 3 | 0 | 1 | 0 | 1 |
| 0 | 0 | 1 | 0 | 0 | 0 | 4 | 1 | 1 | 0 | 1 |
| 0 | 0 | 1 | 0 | 0 | 1 | 5 | 1 | 0 | 0 | 1 |
| 0 | 0 | 1 | 0 | 1 | 1 | 6 | 1 | 0 | * | 1 |
| 0 | 0 | 1 | 0 | 1 | 0 | 7 | 1 | 0 | 0 | 1 |
| 0 | 0 | 1 | 1 | 0 | 0 | 8 | 1 | 1 | 0 | 1 |
| 0 | 0 | 1 | 1 | 0 | 1 | 9 | 0 | 1 | 0 | 1 |
| 0 | 0 | 1 | 1 | 1 | 1 | 10 | 0 | 1 | * | 1 |
| 0 | 0 | 1 | 1 | 1 | 0 | 11 | 0 | 1 | 0 | 1 |
| 0 | 1 | 0 | 0 | 0 | 0 | 12 | 1 | 1 | 0 | 1 |
| 0 | 1 | 0 | 0 | 0 | 1 | 13 | 1 | 0 | 0 | 1 |
| 0 | 1 | 0 | 0 | 1 | 1 | 14 | 1 | 0 | 1 | 1 |
| 0 | 1 | 0 | 0 | 1 | 0 | 15 | 1 | 0 | 0 | 1 |
| 0 | 1 | 0 | 1 | 0 | 0 | 16 | 1 | 1 | 0 | 1 |
| 0 | 1 | 0 | 1 | 0 | 1 | 17 | 0 | 1 | 0 | 1 |
| 0 | 1 | 0 | 1 | 1 | 1 | 18 | 0 | 1 | 1 | 1 |
| 0 | 1 | 0 | 1 | 1 | 0 | 19 | 0 | 1 | 0 | 1 |
| 0 | 1 | 1 | 0 | 0 | 0 | 20 | 1 | 1 | 0 | 0 |
| 0 | 1 | 1 | 0 | 0 | 1 | 21 | 1 | 0 | 0 | 0 |
| 0 | 1 | 1 | 0 | 1 | 1 | 22 | 1 | 0 | 1 | 0 |
| 0 | 1 | 1 | 0 | 1 | 0 | 23 | 1 | 0 | 0 | 0 |
| 1 | 1 | X | 1 | 0 | 0 | 24 | 1 | 1 | 0 | 1 |
| 1 | 1 | X | 1 | 0 | 1 | 25 | 0 | 1 | 0 | 1 |
| 1 | 1 | X | 1 | 1 | 1 | 26 | 0 | 1 | 0 | 1 |
| 1 | 1 | X | 1 | 1 | 0 | 27 | 0 | 1 | 0 | 1 |
| 1 | 1 | X | 0 | 0 | 0 | 28 | 1 | 1 | 0 | 1 |
| 1 | 1 | X | 0 | 0 | 1 | 29 | 1 | 0 | 0 | 1 |
| 1 | 1 | X | 0 | 1 | 1 | 30 | 1 | 0 | 0 | 1 |
| 1 | 1 | X | 0 | 1 | 0 | 31 | 1 | 0 | 0 | 1 |

FIG. 3B

| A/D CMP EN | INTEG DIREC | WAIT FOR 1 CYCLE OR UNTIL | EFFEC PES CNTR DIREC | COURSE PES COUNTER | CYCLE AND MID PES COUNTER | MOD 16 AND FINE PES COUNTER | FUNCTN |
|---|---|---|---|---|---|---|---|
| 0 | XXXX | START=1 | | | | | DEMODULATION |
| 0 | XXXX | | | | | COUNT UP | |
| 0 | ↑ | | | | LOAD 100 IN CYCLE CNTR | COUNT UP | |
| 0 | UP | CYCLE COUNT | DOWN | CLEAR AT 71 COARSE PES | RUN CYCLE CNTR | LD 71 0100 MOD 16 CT | |
| 0 | ↓ | | ↑ | COUNT UP | | COUNT UP | |
| 0 | XXXX | | | | | | |
| 0 | ↑ | | ↓ | | LOAD 000 IN CYCLE CNTR | | |
| 0 | DWN | CYCLE COUNT | DOWN UP | COMPL AT 72 COARSE PES | RUN CYCLE CNTR | | |
| 0 | ↓ | | ↑ | COUNT UP | | | |
| 0 | XXXX | | | | | | |
| 0 | ↑ | | ↓ | | LOAD 100 IN CYCLE CNTR | | |
| 0 | UP | CYCLE COUNT | UP | STOP AT 73 COARSE PES | RUN CYCLE CNTR | | |
| 0 | ↓ | | | | | | |
| 1 | XXXX | -START=1 | | | | | A/D CONVERSION |
| 1 | ↑ | -A/D WAIT=1 | | | CLEAR MID PES | CLEAR FINE PES | |
| 1 | DWN | NEG A/D CMP | UP | CARRY | COUNT UP | | |
| 1 | ↓ | | | | | | |
| 1 | XXXX | | | | | | |
| 1 | ↑ | | | COMPL COARSE PES | COMPL COARSE PES | | |
| 1 | UP | POS A/D CMP | DOWN | CARRY | COUNT UP | | |
| 1 | ↓ | | | | | | |
| 1 | XXXX | | | | | | |
| 1 | ↑ | | | COMPL COARSE PES | COMPL MID PES | | |
| 1 | DWN | NEG A/D CMP | UP | CARRY | CARRY | COUNT UP | |
| 1 | ↓ | | | | | | |
| 1 | XXXX | | | | | | RESET INTEGRATOR |
| 1 | ↑ | | | | | | |
| 1 | UP | POS A/D CMP | | | | | |
| 1 | ↓ | | | | | | |
| 1 | XXXX | | | | | | |
| 1 | ↑ | | | | | | |
| 1 | DWN | NEG A/D CMP | | | | | |
| 1 | ↓ | | | | | | |

PHASE DIFFERENCE DEMODULATOR

TECHNICAL FIELD

Phase difference demodulator for measuring the phase difference between two signals of the same frequency, time multiplexed onto a single analog input, and providing a precision digital output position signal representing the phase difference.

BACKGROUND ART

The current practice of determining transducer position in magnetic storage devices during accessing and following data tracks on a rotating medium such as a disk is through amplitude measurement of signals from adjoining servo tracks thereby generating a net signal indicative of the radial displacement from a predetermined track centerline. As track densities have increased, the capability of this practice has been enlarged by progressing from dibit to tribit to pentabit servo formats thereby increasing the number of tracks in the capture area, and enabling a more precise track identification.

One of the problems with the current practices has been the susceptibility to inaccuracy as a result of random electrical noise occurring during the servo signal window. To mitigate this disability, the servo format has, in the past, used redundant signals which are averaged to obtain a more uniform approximation.

DISCLOSURE OF THE INVENTION

The phase difference demodulator measures the phase difference between two signals of the same frequency, generates a digital output signal representative of the phase difference through a digital circuit with an error in an approximation represented by an analog remainder and converts the analog remainder to a digital value which is added to the approximation using the same components to generate the analog remainder so that the precision of the digital output signal represents the phase difference. The phase difference demodulator measures the phase difference between the two signals with the same frequency multiplexed onto a signal input channel, and provides the precision digital output signal representing the phase difference. The error signal is generated with respect to a multi-track region and a multi- bit digital output signal is generated wherein the most significant bits indicate one of the multitude of tracks and the remaining bits provide position information with regard to track pitch with progressively more exacting resolution.

One significant aspect and feature of the present invention is that an error signal can be generated with respect to a four track region, and an 11-bit digital output signal is generated where the two most significant bits indicate one of the four tracks and the remaining 9 bits provide position information with regard to one track pitch with progressively more exacting resolution.

Another significant aspect and feature of the present invention is that the phase difference demodulator converts an analog error signal to a digital output signal that achieves an 11-bit resolution over a four track region of a magnetic disk. Thus, the resolution is in increments of 1/512 of a track providing very accurate head position information. This is very important for direct access storage devices.

BRIEF DESCRIPTION OF THE DRAWINGS

FIGS. 3A and 3B illustrate a demodulator finite state control sequencer table for the phase difference demodulator circuit of FIG. 2; and, FIG. 4 illustrates a differential integrator circuit utilized in the phase difference demodulator.

DESCRIPTION OF THE INVENTION

Figure 1:
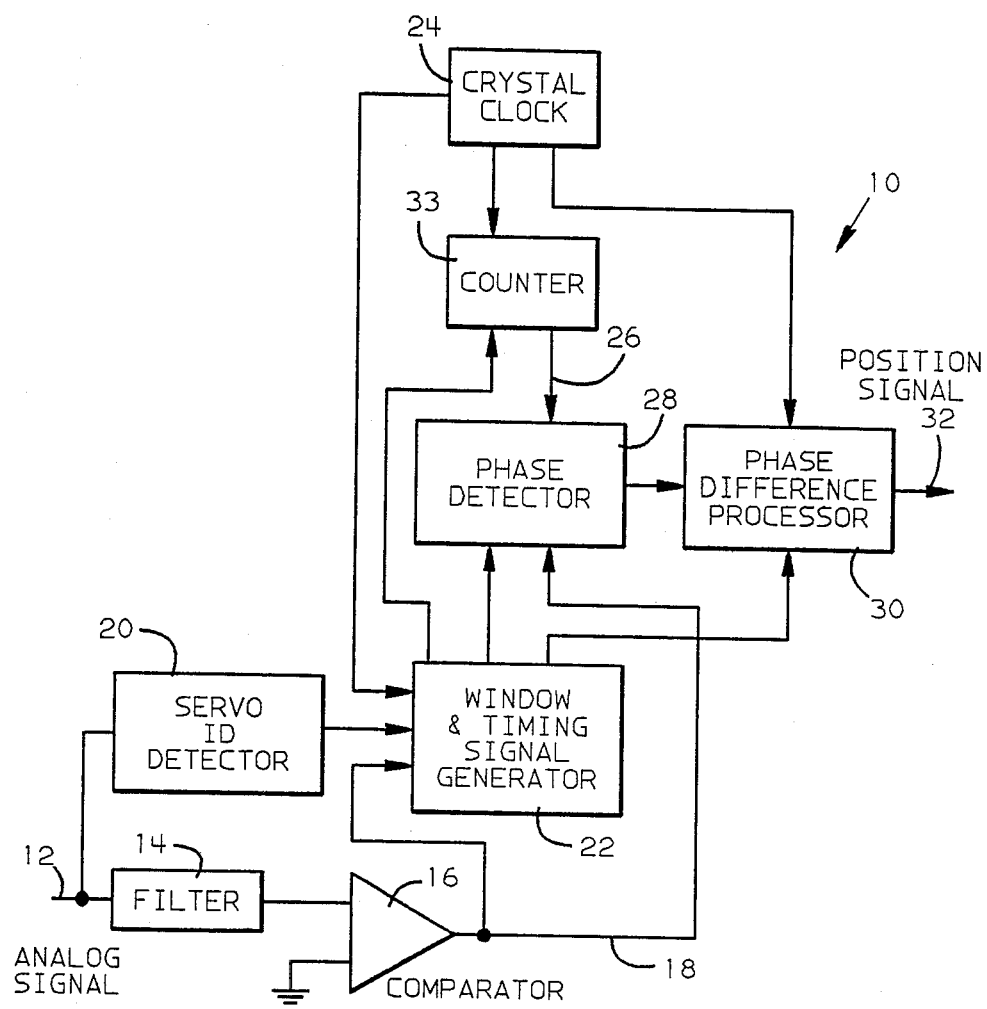
FIG. 1 illustrates a block diagram of a phase difference demodulator for producing a position signal from an analong signal.

FIG. 1 illustrates a block diagram of a phase difference demodulator 10 for obtaining a position signal from two constant frequency servo fields having radially varying phase. The phase difference demodulator 10 measures the phase difference between the two signals of the same frequency, time multiplexed onto a single analog input channel line 12 and provides a precision digital output position signal on line 32 which is actually 11 lines, one for each bit, and representing this phase difference. The input analog signal consists of two signals of the same frequency with an arbitrary phase difference 0° to 360° between the signals. The input signals are multiplexed onto the same input channel so that only one of the two signals appears at a time. The position output signal on line 32 is provided within a short period of time following the input signal so that the circuit is suitable for use within a servo position control loop for the magnetic recording head of a disk file. The analog signal from a transducer head is received on line 12 and is converted by filter 14 and comparator 16 to a digital signal on line 18. A servo ID detector 20 identifies a servo sector, whereupon window and timing signal generator 22 creates windows for the radially varying phase constant-frequency servo fields. A crystal clock circuit 24 outputs a signal with a frequency which is an integer multiple of the frequency of the constant frequency servo fields. The crystal clock frequency is divided down to the same frequency as the servo signal by counter 33. Within a servo window, this counter is started on the next clock following a transition on line 18 so that the output approximates the data signal. The phase of the counter output signal on line 26 is compared with the phase of the digital signal 18 for each of the constant-frequency servo fields by phase detector 28. The difference between the compared values derived from the two fields is ascertained by the phase difference processor 30 to produce a position signal on line 32 which is indicative of the transducer position within the radial distance encompassed by 360° of phase difference.

The crystal clock 24 with a low phase jitter operates at a frequency which is a multiple of the signal frequency. Utilizing the clock 24 and the logic circuits 20, 22, 28, 30 and 33, the demodulator 10 generates synchronous approximations to the two input signals. These synchronous approximations are slightly delayed versions of the original signals, and change value only at specific times synchronous with transitions of the clock 24. The synchronous approximations change states only on clock transitions, and the clock transitions occur an integer number of times per cycle of the signal. Digital logic is used to compute the phase difference between the two synchronous approximations without error. Exclusive "or"ing the multiplexed input signal with the synchronous approximations produces a string of pulses whose widths correspond to the error in phase introduced by replacing the original signals with the synchronous approximations.

An integrator in the phase difference processor 30 initially set at zero adds up the error represented by these pulse widths. During N pulses associated with signal 1, the integrator is charged up at a fixed constant rate during the time represented by the pulse widths; and, during N pulses for signal 2, the integrator is charged at the same fixed rate while the pulse is present but in the opposite direction. Thus at the end of the servo pattern, the integrator holds a voltage proportional to the error in the synchronous approximations.

This error voltage is digitized and added to the original phase difference estimate in a two step process. In the first step, the integrator is discharged toward zero at the same fixed rate for an integral number of cycles of the crystal clock 24. This discharge proceeds until zero is crossed and stops on the next clock transition. The direction is reversed and integration proceeds again toward zero until zero is crossed and the next transition cycle occurs. This direction reversal compensates for errors introduced by the finite rise and fall times associated with turning the integrator on and off. The direction and next number of clock cycles required for the first step are used to correct the original estimate of the phase difference obtained from the synchronous signal approximations. If the clock frequency is M times the signal frequency and N pulses are integrated for each of the two signals, then each count in the first step corresponds to a correction of $360° \div (N \times M)$. Because the integrations in the first step are started and stopped on clock transitions and the same fixed rate of integration is used in demodulation, the voltage remaining on the integrator still represents the error in the now corrected phase difference. The voltage is smaller than the maximum signal possible at the start of the first step, so the signal may be rapidly digitized with greater resolution using a smaller fixed rate of integrations in the second step. The rate in integration in the second step can be R times smaller than the first step. Then each count of the clock in the second step corresponds to a phase difference of $360° \div (M \times N \times R)$. In the second step, the integrator proceeds exactly as the first step except that the integrations always terminate after zero is crossed in the position direction so as to eliminate the effects of any hysteresis which may be present in the comparator used to detect the zero crossings.

The comparator establishes the initial zero voltage condition prior to demodulation of the next servo pattern by integrating at a third smaller fixed rate towards zero as defined by the comparator. The larger fixed current is R times the smaller current. The use of same cmparator for setting the initial zero state and detecting zero crossings in digitizing eliminates errors in the output due to input offsets in the comparator. The precision of the position signal is enhanced by the use of the crystal clock which provides a stable reference for time measurements. Also, averaging over many transitions of the input signals reduces the effect of timing jitter due to noise in any one of the transitions. Since the integration of the pulse width modulated error pulses and the first step of the digitalization uses the same fixed rate of integration, the tolerances required on the capacitor in the integrator and the current source used are not critical. The rate must be the same in both directions to a high degree of accuracy, and the rates for first and second steps must have the correct ratio to within $0.25 \div R$. The resolution of the final result is $360° \div (M \times N \times R)$.

Figure 2A:
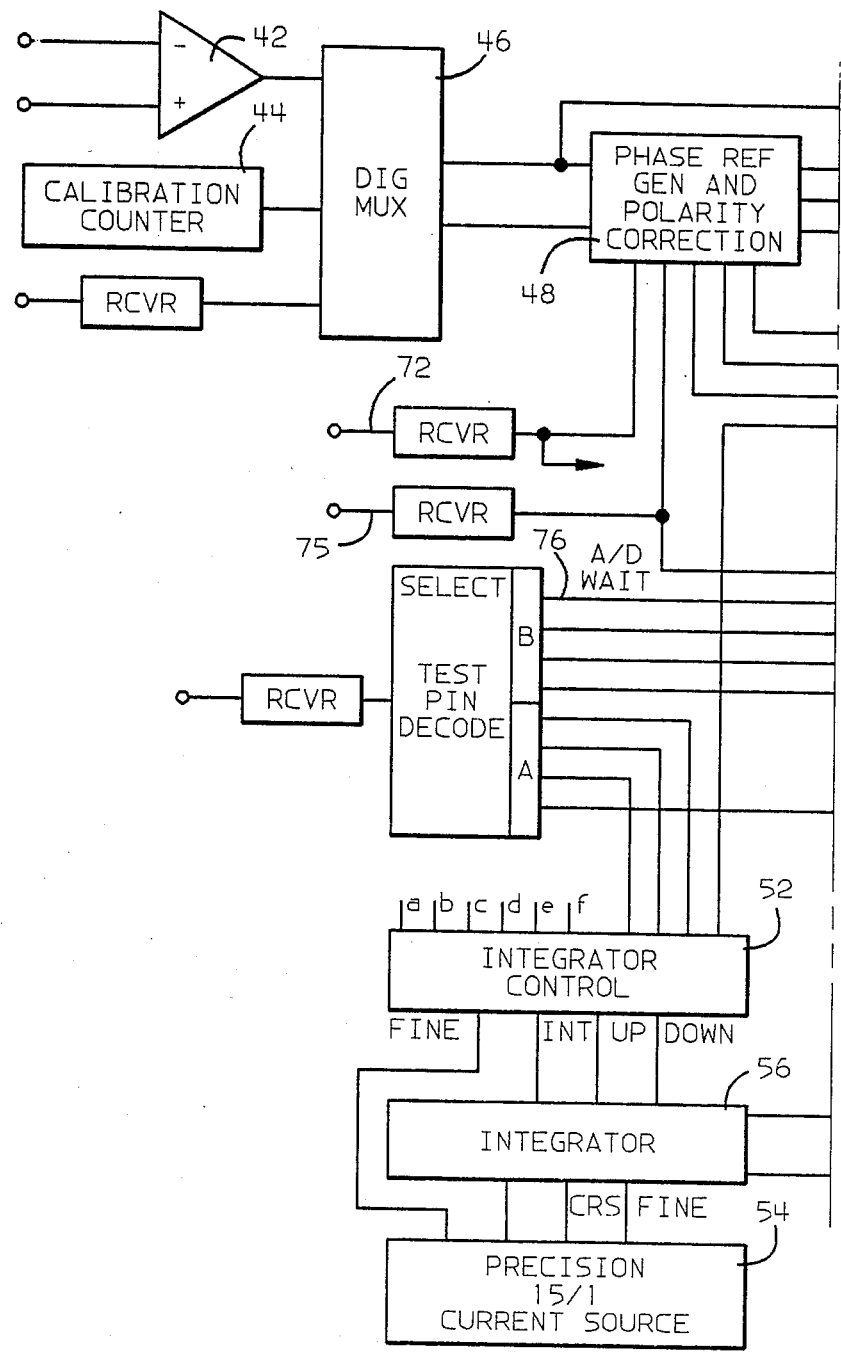
FIGS. 2A and 2B illustrates a schematic diagram of a phase difference demodulator circuit.
Figure 2B:
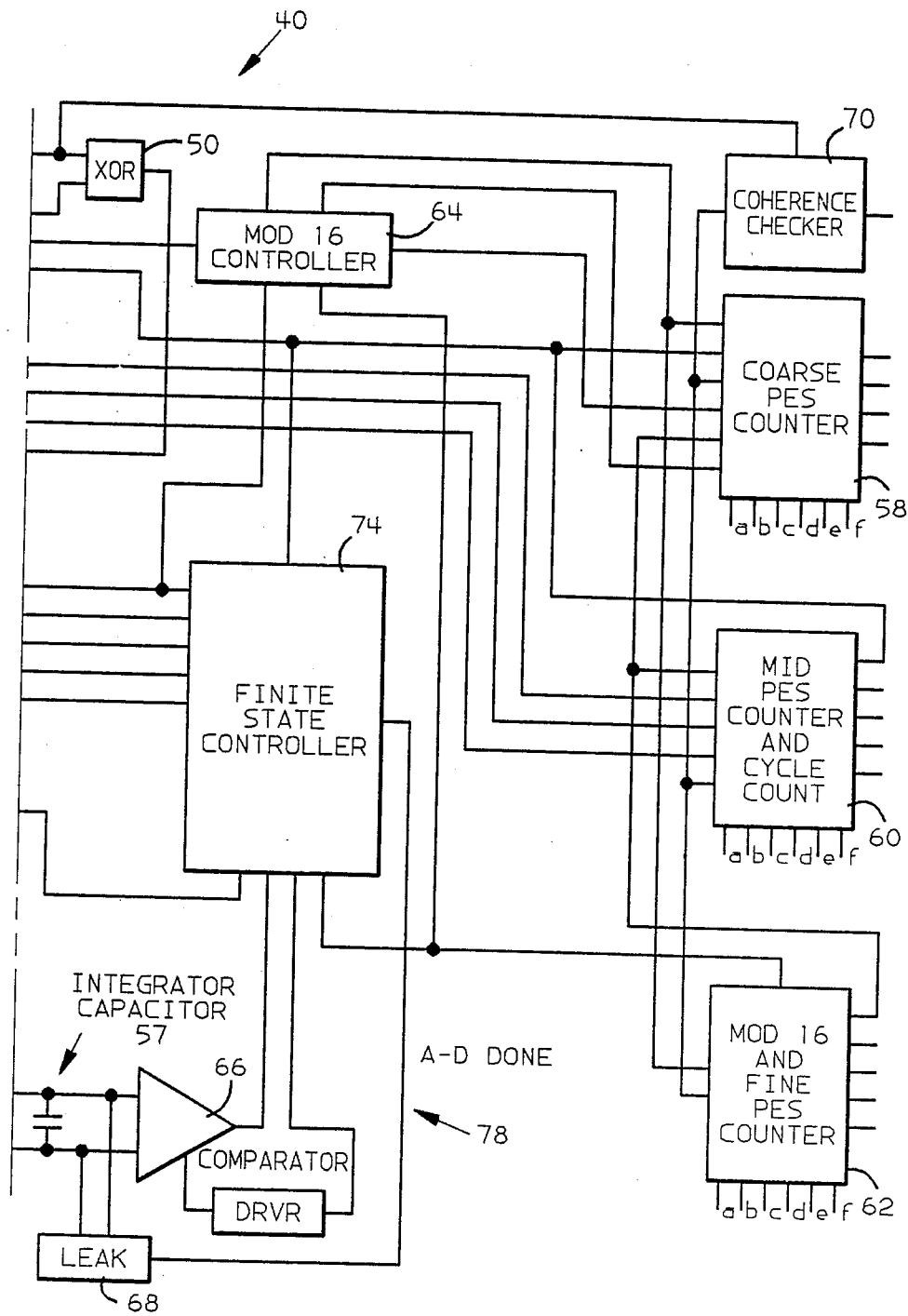

FIGS. 2A and 2B illustrate a circuit 40 for implementating the phase difference demodulator 10 of FIG. 1. A zero crossing detector 42 is a differential input comparator which takes the analog output of a filter, removes noise from the input signal and provides a digital output signal. All of the information obtained from the servo pattern is represented in the timing of the transitions of the output of the zero crossing detector. A digital multiplexer 46 takes inputs from the zero crossing detector 42 or a calibration counter 44. The purpose of that is to provide a 2.5 MHz square wave. The calibration counter 44 provides calibration based on zero phase shift between three servo bursts providing a number very close to zero, and also subtracts out the errors in the analog circuitry due to leakage or other defects in the integrator. The digital multiplexer 46 selects either the input analog signal from the zero crossing detector or the calibration counter signal, and sends the signal to the circuitry.

A phase reference generator and polarity correction circuit 48 is now described. The phase reference generator is a three bit counter driven by a 20 MHz clock signal to yield a 2.5 MHz output. The phase reference generator as a three bit counter starts up with synchronized data coming out of the zero crossing detector 42 or the calibration counter 44. The first transition in the window can be either up or down, and integration starts on either the first positive or negative transition within the window. An exclusive 'or' 50 detects the phase difference between the data from the zero crossing detector 42 and the phase reference generator 48. The width of the pulse out of the exclusive 'or' 50 is proportional to the phase difference. The output of the exclusive 'or' 50 connects to an integrator control block 52 whose function is to control an analog integrator 56 which connects to a capacitor 57 in this example. Either side of the integrating capacitor 57 ties into a voltage reference as controlled by integrator 52 and current is drawn out of the other side. There are two different current levels drawn out of the integrating capacitor at a ratio of 16 to 1 as a coarse current and as a fine current. During demodulation, only coarse current is used. Integration is either up or down depending on the window while the current is a constant current switched into the integrating capacitor according to the width of the pulses from the exclusive 'or' 50.

As an example, a first window can integrate over four cycles of a servo pattern of 2.5 MHz; the second burst integrates over eight cycles; and the third burst, which normally has the same phase as the first burst, and integrates over four cycles again. The total is eight cycles of one phase and eight cycles of the other phase. The integrator at the end of cycle has a voltage which represents the error in the three bit digital approximation which is obtained by subtracting the two numbers out of the phase reference generator 48. The actual subtraction of the three bits out of the phase reference generator and the other bits which are obtained later on by doing an A-to-D operation on the integrator, are accumulated in counters 58, 60, and 62 as now described in detail.

A coarse position error signal (PES) counter 58 is a four bit counter. This counter operates at 20 MHz and starts counting on the first positive transition within the first data window. On the first positive transition in the second data window, the counter is not stopped but instead the direction of the counter is reversed so that the counter is counting down instead of counting up. When the first positive transition on the third data window occurs, the coarse PES counter 58 is stopped. The purpose is to obtain a four bit approximation of the phase difference between the average of the first and third burst, and the second burst.

At the end of the demodulation after counting through all three of the bursts, a four bit approximation to the position signal is obtained in the coarse PES counter 58 and an analog voltage on the integrator 56 represents the error in that approximation. The same coarse current is used to integrate back until zero is crossed which is determined by the zero crossing comparator 66. The zero crossing comparator zeros the integrator 56, as well as digitizing the voltage thereby eliminating error due to input offset voltage from the position error signal output. The comparator 66 connects across the output of the integrator 56 and capacitor 57 and determines zero crossings. A mid PES counter 60 counts up the times for integrating with the same current to charge up the capacitor 57, and determines the error in the approximation as integrated over 16 transitions as the phase of both the positive and negative transitions are measured 16 times. By using the same current, 16 times more resolution is obtained because each A-to-D operation is only counted once. This means more precision; therefore, the mid PES counter 60 can, if it over flows, carry or borrow from the coarse PES counter 58. Integration always starts in the same direction and integration occurs until a specific integrator voltage polarity occurs. If the correct polarity has already occurred, there is a stop after the first count. Integration starts and stops on discrete clock edges. When this operation completes, a signal is in counter 58 and 60, and a voltage on the capacitor 57 which represents the error in that seven bit approximation.

The current source on the integrator is now changed, scaled down by a factor 16, and the same operation is repeated again. Integration occurs until a zero crossing, while counting clock cycles with the fine PES counter 62. The fine PES counter 62 can again carry into the higher seven bits and the result is an 11 bit number which represents the phase difference between the average phase of the first and third burst, and the second burst. The next step is to use the integrator 56 and the comparator 66 to zero the voltage on the capacitor 57. This is done so that any voltage offset on the input comparator is not reflected in the final number on the next demodulation cycle.

The counters can actually be used twice. The mid PES counter 60 is used also for the cycle counter. The cycle counter 60 is what determines how many cycles of the input signal are integrated. The cycle counter 60 determines integration over four cycles of the first burst, eight cycles of the second burst and four cycles of the third burst. For example, the mod 16 counter 62, during demodulation, is used as the fine PES counter 62 during the final A-to-D operation. The counters are shared twice during the operations.

The coherence checker 70 verifies that the incoming data does appear as a 2.5 MHz square wave signal. The phase reference generator 48 starts synchronously with the first transition of the data. The coherence checker 70 compares the servo signal and phase reference generator 48. If the transitions do not occur in a lock step fashion or are out of phase by 180 degrees, then a latch is set and the coherence checker 70 notifies the servo processor that the signal does not look like a servo signal. The precision current source 54 consists of two current sources in a ratio of 15 to 1. Both current sources are turned on when the coarse current, 16 times larger than the fine current source is required. Turning off the larger current source produces the fine current. The minus window 72 is the signal which is high the majority of the time and is low during each of the three servo bursts. The entire circuit 40 is controlled by the finite state controller 74 which is a counter and sequentially goes through all the states required. The start pulse 75 puts the controller 74 into a state where the controller is ready for demodulation. As soon as the first transition in the first window occurs, the controller 74 measures the phase and goes into demodulation. When the third window is done, and when all data is demodulated, the finite state controller 74 goes into a wait state. The wait state enables the comparator 66, which has been turned off to minimize leakage. As soon as the A-to-D wait line goes high, the analog-to-digital conversion of the bottom 8 bits of the PES occurs. The A-to-D wait signal allows the comparator time to stabilize after the comparator is turned on. The A-to-D done line 78 provides status that the data is ready to be accessed and also turns on the leakage circuit 68. The leakage circuit 68 provides leakage across the capacitor 57 and is used in the zeroing mode for driving the leakage circuit 68 back and forth across zero. The A-to-D done line 78 notifies when the data is ready and turns on the leakage circuit 68.

FIGS. 3A and 3B illustrates a demodulator finite state controller sequence table setting forth the position error signal controllers with respect to demodulation, A/D conversion, and resetting of the integrator, as well as the integration direction.

The phase difference demodulator of the figures utilizes digital circuits and analog circuits for providing an accurate digital representation from phase-encoded servo data. The digital and analog circuits can be incorporated on a single chip for purposes of manufacturing. The time required to process one position sample is on the order of ten microseconds. The demodulating is achieved by the digital and analog circuitry acting in concert with each other. First, the digital circuitry is utilized for approximating the most significant part of the result; in the example, the upper 3 bits of the eleven bits. Second, the error in the first approximation is acquired in analog form as a voltage on the capacitor. The same capacitor and current source is utilized in demodulating the different servo bursts to obtain the phase difference. A differential scheme of the integrating capacitor connected between switching transistors of the integrator as described in FIG. 4 and connected across the comparator in the differential scheme maintains high accuracy since there is no dependence upon the accuracy of the specific values of the capacitor and the current source. Third, the same components of the capacitor and current source are utilized in the analog-to-digital conversion providing the least significant 8 bits. Neither the capacitor nor the current source have to be precision components thereby reducing component cost. Fourth, the analog-to-digital step utilizes a fine and coarse current source which produces an end result with accuracy of one part in 256 (0.39%), with the only requirement for the current sources is that the fine current source is one-sixteenth of the course current source to within about three percent. Therefore, high accuracy is maintained with off the shelf components and without using expensive processes. Also, the current source and integrating capacitor are utilized for both demodulation and A-to-D conversion reducing a requirement of precision components thereby reducing cost of manufacture.

Figure 4:
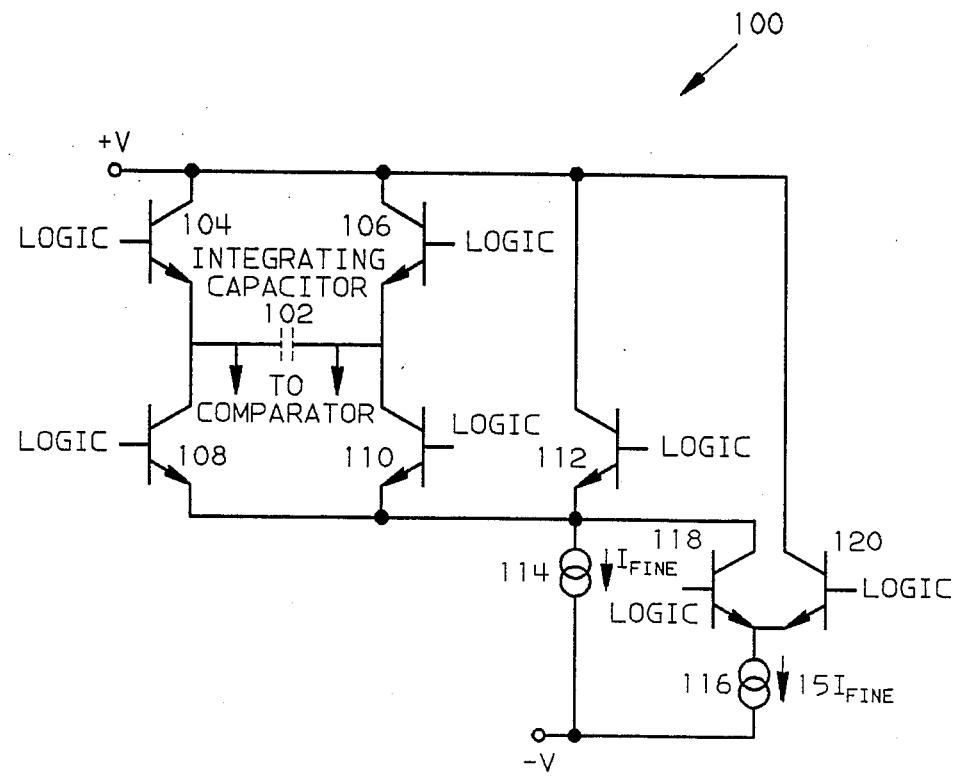

FIG. 4 illustrates a differential integrator circuit 100 utilizing a current source integrating capacitor 102. Four switching transistors 104, 106, 108, and 110 are connected in a configuration denoted as an "H-configuration". The integrating capacitor 102 is the cross-bar connection of the H-configuration of transistors 104-110. The transistors 104-110 are operated as switches, and the bases of each transistor is driven by the logic signals of the switching logic of the phase difference demodulator circuit 40. Dump transistor 112 is utilized as a dump transistor to divert all current away from the integrating capacitor 102 so that the capacitor is not charged in either direction. A fine current source 114 connects through a switching transistor 112. A coarse current source 116 connects through the switching transistor 118 and a dump transistor 120 which diverts the coarse current. The upper two legs of the H-configuration of the transistors connects to the positive side of the voltage source. The differential integrating circuit is an elegant circuit in that the circuit has three modes of operation. In the first mode, the capacitor is charged in one direction in that the transistor on the upper side and the opposite bottom transistor is turned on and connects to the voltage source which charges the integrating capacitor with current in one direction. In the second mode, the opposite transistors are turned on and the previous transistors are turned off, and the integrating capacitor is charged with current in the opposite direction. In a third mode of operation, all current is diverted away by the dump transistor 112, and the integrating capacitor is not charged in either direction. The bottom two transistors 108 and 110 of the H-configuration are fed by the current sources while the upper two transistors 104 and 106 connect to the voltage supply. The coarse current source 116 can either be connected or diverted by the dump transitor 120 while the fine current source is always connected in the circuit 100. In this particular example, the course current source has a value of 15 times that of the fine current source. The integrating capacitor 102, as described in this circuit, connects to the comparator 66 and is the integratng capacitor 57 of FIGS. 2A and 2B.

What is claimed is:

1. A phase demodulation system comprising:
   a. means for measuring phase difference between two signals of the same frequency;
   b. means for generating a digital output representative of said phase difference by approximating said phase difference with a digital means and means generating an error in approximation represented by an analog remainder, said error generating means including an exclusive "OR" gate for converting said approximated phase difference to pulse widths, and a current source means connected to an integration means, said current source means and said integration means connected to said two signals and said pulse widths differentially gating said current source means; and,
   c. means for converting said analog remainder to a digital value which is added to said approximation of said phase difference of said digital means whereby the precision of the digital output signal representing said phase difference results in enhanced accuracy.

2. System of claim 1 wherein said measuring means includes means for generating a digital signal and means for generating an analog signal.

3. System of claim 1 comprising switch means for switching said current source means between sides of said integration means.

4. System of claim 1 wherein said integration means comprises a capacitor.

5. System of claim 1 wherein means for generating a digital output from said analog generation means comprises a finite state controller means, a coarse current means and a fine current means connected between said finite state controller means and said integration means.

6. Process of measuring phase difference between two signals of a same frequency time multiplexed onto a single analog input comprising the steps of:
   a. generating a digital output signal representative of said phase difference through a digital circuit and providing an error in an approximation represented by an analog remainder;
   b. converting said analog remainder to a digital value; and,
   c. adding said digital value to said digital output signal thereby providing a precision digital output signal representing said phase difference.

7. Process of claim 6 comprising the step of acquiring said error as a voltage on an integrating capacitor.

8. Process of claim 6 comprising the step of zero crossing comparing for zeroing said integrator and digitizing said voltage on said integrating capacitor.

9. Process of claim 6 comprising the step of a coherence checking incoming data.

10. Process of claim 6 comprising the step of calibrating based on zero phase shift between three servo bursts.

11. Process of claim 7 comprising the step of determining differential voltage across said integrated capacitor, and comparing said differential voltage on said integrating capacitor for zero crossing.

12. Process of claim 11 comprising the step of switching a coarse current source and a fine current source across said integrating capacitor differentially.

13. Process of claim 12 comprising the step of using said current source and said integrating capacitor for both demodulation and A-to-D conversion.

14. Phase difference demodulator for measuring the phase difference between two signals of the same frequency time multiplexed onto a single analog input line and providing a precision digital output position signal comprising:
   a. servo ID detector and a filter connected to an analog signal;
   b. window and timing signal generator connected to a clock, said servo ID detector and a comparator connected to said filter;
   c. phase detector connected to said window and timing generator, said comparator, and a counter, said counter connected to said clock and said window and timing generator; and,
   d. phase difference processor connected to said phase detector, said clock and said window and timing generator for generating a position signal from two constant frequency servo fields having radially varying phase.

* * * * *